United States Patent
Kawamata

[11] Patent Number: 5,982,661
[45] Date of Patent: Nov. 9, 1999

[54] MEMORY DEVICE

[75] Inventor: Junya Kawamata, Kawasaki, Japan

[73] Assignee: Fujitsu Limited, Kawasaki, Japan

[21] Appl. No.: 09/247,546

[22] Filed: Feb. 10, 1999

[30] Foreign Application Priority Data

Jul. 31, 1998 [JP] Japan .................................. 10-217916

[51] Int. Cl.$^6$ .................................................. G11C 16/04
[52] U.S. Cl. .............................. 365/185.01; 365/185.11; 365/185.29; 365/218
[58] Field of Search ......................... 365/185.01, 185.11, 365/185.24, 185.26, 185.28, 185.29, 218

[56] References Cited

U.S. PATENT DOCUMENTS

| | | | |
|---|---|---|---|
| 4,829,203 | 5/1989 | Ashmore, Jr. ....................... | 365/185.01 |
| 5,329,487 | 7/1994 | Gupta et al. ........................ | 365/185.01 |
| 5,469,381 | 11/1995 | Yamazaki ............................ | 365/185.01 |
| 5,740,106 | 4/1998 | Nazarian ............................. | 365/185.01 |
| 5,812,450 | 9/1998 | Sansbury et al. ................... | 365/185.01 |

FOREIGN PATENT DOCUMENTS 3-123118 5/1991 Japan .
5-6700 1/1993 Japan .

*Primary Examiner*—Trong Phan
*Attorney, Agent, or Firm*—Armstrong, Westerman, Hattori, McLeland & Naughton

[57] ABSTRACT

The present invention is a non-volatile memory comprising: first and second floating gate MOS transistors which are electrically written and erased and which are operatively connected between power sources serially; and an output terminal connected to the contact point of the first and second MOS transistors; wherein a first datum is stored by writing to the first MOS transistor and erasing the second MOS transistor, and a second datum is stored by erasing the first MOS transistor and writing to the second MOS transistor. With the aforementioned memory device, through current does not flow to the power source, because only one transistor will be conductive even if read voltage is applied to the control gate of both transistors. Consequently, reading time can be shortened, without leading to increased power consumption, by maintaining the control gate at the read voltage level.

3 Claims, 6 Drawing Sheets

FIG. 1

FIG. 2
MEMORY CELL ARRAY

FIG. 3
FUNCTION SETTING MEMORY

VOLATAGE OF EACH NODE FOR EACH OPERATION

| node<br>Operation | CG1, 2 | n1 | n2 | n3 | n4 | n5 | n6 |
|---|---|---|---|---|---|---|---|
| Read | Vread | (GND) | (GND) | (GND) | (GND) | Vcc | GND |
| Program | Vpp | GND | Vprog | Vprog | GND | (GND) | (GND) |
| Erase 1 | Vng | Ver | Float | Float | Ver | (GND) | (GND) |
| Erase 2 | Vng | (GND) | (GND) | (GND) | (GND) | Ver | Ver |

(n15 is Floating)

FIG. 6
PRIOR ART

MEMORY DEVICE

BACKGROUND OF THE INVENTION

1. Field of the Invention

The present invention relates to a non-volatile memory device using a MOS transistor having a floating gate, and relates to a memory device consuming little current and allowing high speed reading.

2. Description of the Related Art

Non-volatile memory, using MOS transistors having floating gates as memory cells, is widely used because the high volume of data stored is not volatile. In particular, flash memory, which has a simplified circuit structure wherein the units erased are limited to relatively large blocks, is in widespread use. This flash memory is a device having normal memory blocks for storing data, as well as a boot block with a smaller capacity. This boot block is an area that is unconditionally accessed at the startup of a system which includes flash memory, for example. Such a boot block houses a top boot block disposed on the upper address side of the block and a bottom boot block disposed on the lower address side. The only difference between these is whether the upper address or lower address is the block selection address which is initially accessed. The memory devices within the boot block are the same.

Flash memory having such a boot block must be the top boot block type or the bottom boot block type, depending on the users' requirements. Consequently, a single type of memory device is manufactured; the information about the type selected according to the users' requirements is stored in the function setting memory; and the block selection address Add1 is switched according to the function setting bit.

Figure 6:
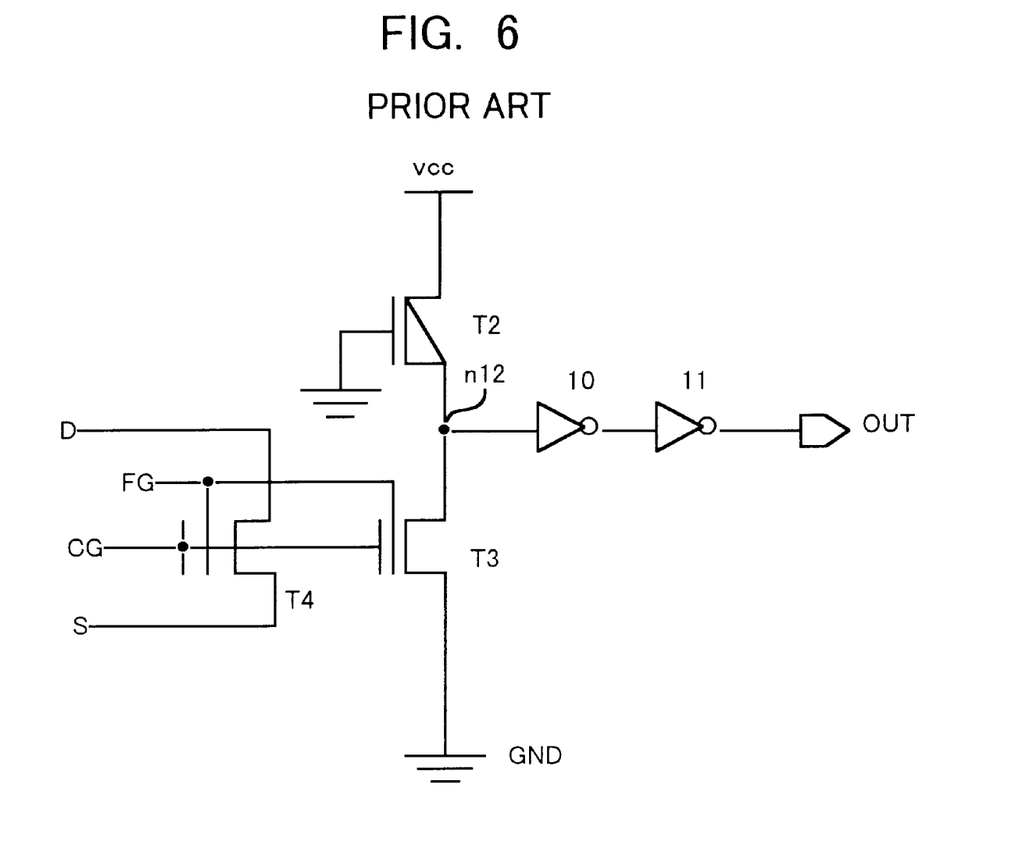
FIG. 6 is a diagram showing an example of the constitution of a conventional function setting memory.

FIG. 6 is a figure showing an example of the constitution of the conventional function setting memory. In the constitution of the conventional memory, like in a normal memory cell, a MOS transistor T3 having a floating gate and which stores data and the load transistor T2 thereof are serially connected between the power source Vcc and ground GND. The load transistor T2 is an P-channel enhance transistor, for example; its gate is maintained at ground potential and it has a prescribed impedance and is continually in a conductive state. The MOS transistor T3 has a floating gate FG. The threshold voltage of the transistor T3 is increased by writing (programming), by adding electrons to the floating gate FG; the threshold voltage thereof is decreased by erasing, by pulling out electrons from the floating gate FG. Consequently, the application of a voltage at a level between these threshold voltages to the control gate CG causes the MOS transistor T3 to become conductive or non-conductive in accord with the stored data.

A prescribed control voltage must be applied to the source and drain of the MOS transistor T3 in order to add or pull electrons from the floating gate FG of the MOS transistor T3. However, it is difficult to apply such a control voltage because the MOS transistor T3 has the circuit structure shown along with the load transistor T2. A separate transistor T4, for writing and erasing and which shares the floating gate FG, is therefore established. The operations of adding and pulling electrons from the floating gate FG is carried out by means of this transistor T4.

This type of memory is read by applying a voltage between the aforementioned threshold voltages to the control gate CG, making the transistor T3 conductive or non-conductive, and detecting the voltage of the contact n12 of the transistors T2, T3. The voltage of the contact point n12 is read from the output OUT by means of inverters 10, 11. In the case where writing is being performed, the transistor T3 becomes non-conductive, the contact point n12 becomes H level, and the output OUT also becomes H level. In the erasing state, the transistor T3 is conductive, the contact point n12 becomes L level, and the output OUT also becomes L level.

In the memory device constitution shown in FIG. 6, when the read voltage is applied to the control gate CG with the transistor T3 in the erasing state, the transistor T3 becomes conductive and the through current flows from the power source Vcc to the transistors T2, T3, and the ground. This current brings about an increase in power consumption. In the power down state where reading is not performed, it is necessary that the control gate CG be kept at ground potential so that through current does not flow, regardless of whether the transistor T3 is in the erasing state or writing state. The potential of the CG rises from ground to a prescribed reading potential only upon transition to an active state for reading data.

Consequently, when using the function setting memory in the memory device constitution shown in FIG. 6, the access time for entering the active state becomes long, because it is necessary to raise the control gate CG of the function setting memory and read the setting information before accessing normal memory.

A redundant memory cell array is included to compensate for bad bits of high capacity flash memory. The redundant ROM stores the address of those bad bits and makes it necessary to raise the control gate CG of the memory device to read the redundant ROM each time the memory is accessed, when using the memory device as shown in FIG. 6 as the redundant ROM. Consequently, this redundant ROM is in concept a type of function setting memory and becomes an obstacle to increasing the speed of a memory device as in FIG. 6.

SUMMARY OF THE INVENTION

It is an object of the present invention to provide a memory with a high reading speed and lower power consumption and which resolves the aforementioned issues.

It is another object of the present invention to provide a memory wherein through current does not flow even if the potential of the control gate remains constant.

To achieve the aforementioned objects, the present invention is a non-volatile memory comprising:

first and second floating gate MOS transistors which are electrically written and erased and which are operatively connected between power sources serially; and an output terminal connected to the contact point of the first and second MOS transistors;

wherein a first datum is stored by writing to the first MOS transistor and erasing the second MOS transistor, and a second datum is stored by erasing the first MOS transistor and writing to the second MOS transistor.

With the aforementioned memory, through current does not flow to the power source, because only one transistor will be conductive even if read voltage is applied to the control gate of both transistors. Consequently, reading time can be shortened, without leading to increased power consumption, by maintaining the control gate at the read voltage level.

Furthermore, to achieve the aforementioned objects, the present invention is a non-volatile memory, having a plurality of floating gate memory cells and comprising:

a plurality of normal memory blocks comprising the memory cells;

a boot memory block comprising the memory cells;

a block decoder which is supplied a block selection address and which selects the plurality of normal memory blocks and boot memory block;

an address supply portion for inverting or not inverting the block selection address supplied to the block decoder depending on a function setting bit; and function setting memory for storing the function setting bit;

wherein the function setting memory comprises:

a first and second floating gate MOS transistor which are electrically written and erased and which are operatively connected between power sources serially; and an output terminal connected to the contact point of the first and second MOS transistors;

wherein a first datum is stored by writing to the first MOS transistor and erasing the second MOS transistor, and a second datum is stored by erasing the first MOS transistor and writing to the second MOS transistor.

With the aforementioned invention, maintaining the floating gate of the function setting memory transistor at the read voltage makes it possible to output stored data continuously to the output terminal without increased power consumption and to increase reading speed.

DESCRIPTION OF THE PREFERRED EMBODIMENTS

The preferred embodiments of the present invention are explained below with reference to the figures. However, the technical scope of the present invention is not limited to these embodiments.

Figure 1:
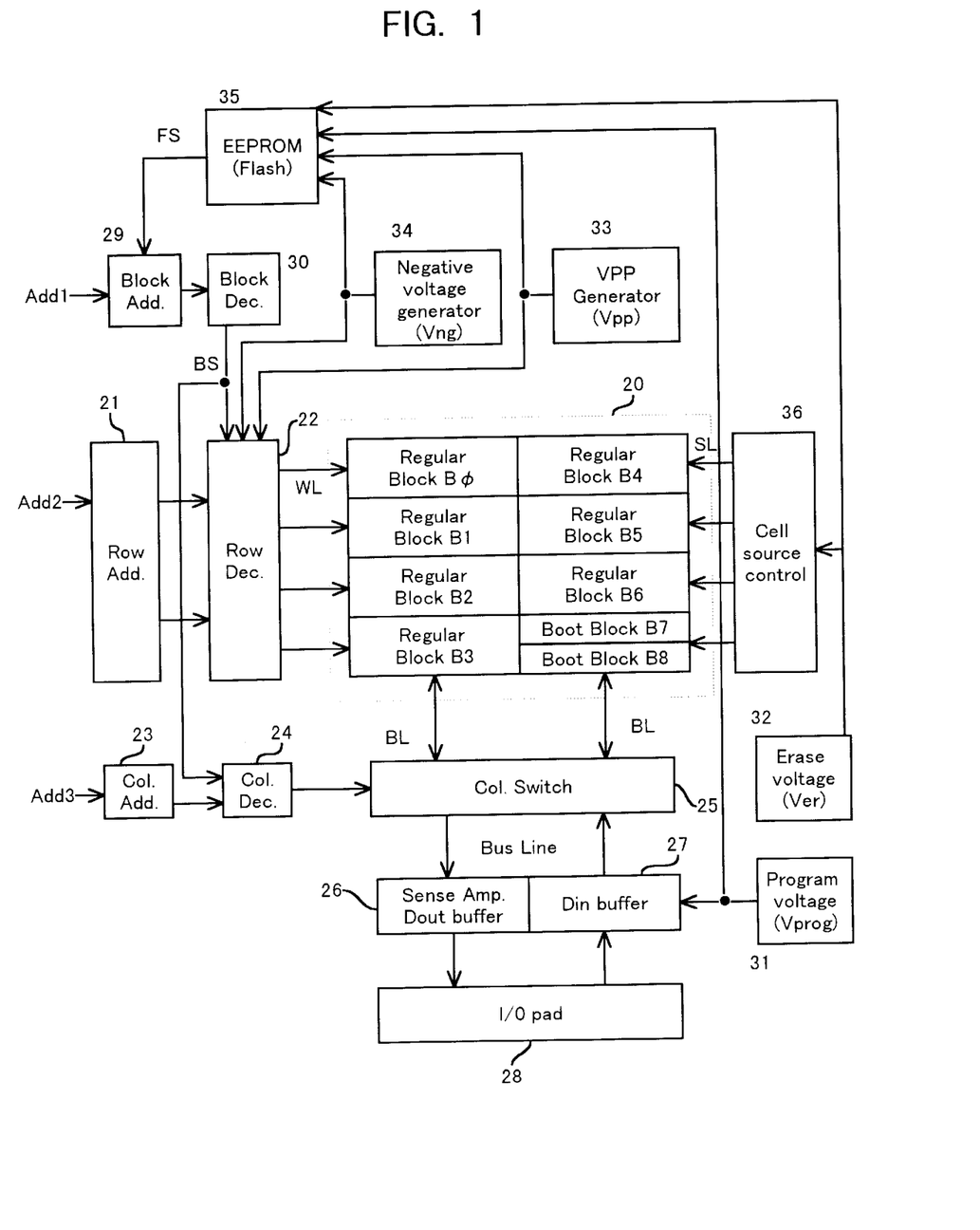
FIG. 1 is a diagram of the constitution of non-volatile memory such as flash memory.

FIG. 1 is a diagram of the constitution of non-volatile memory such as flash memory. In this example, the memory array 20 comprises normal blocks B0–B6 and boot blocks B7 and B8. The boot blocks B7 and B8 have a smaller capacity than the normal blocks. A row address Add2 is supplied to the row address buffer 21; the row address is decoded by the row decoder 22; and the prescribed wordline WL is selected. Also, a column address Add3 is supplied to the column line address buffer 23; the column address is decoded by the column decoder 24; and the prescribed bitline BL is selected by the column switch circuit 25.

The bitline selected by the column switch circuit 25 is connected to the sense amp 26 and input buffer 27, for reading or for writing. The sense amp 26 and input buffer 27 are further connected to the input/output pad 28.

The following circuits are included for reading, erasing, and writing (programming) to the memory cells within the memory cell array 20: high voltage Vpp generating circuit 33, program voltage Vprog generating circuit 31, erase voltage Ver generating circuit 32, and negative voltage Vng generating circuit 34. Furthermore, a cell source control circuit 36 is provided to control the state of the source lines SL of the memory cells.

A block address buffer 29, to which the block selection address Add1 is supplied, and a block decoder 30, for decoding that block selection address, are provided in order to select a block within the memory cell array 20. This block address buffer 29 has functions not only for inputting the block selection address and supplying it to the decoder 30; but also for performing an address supply circuit having the function of inverting or not inverting the block selection address according to the function setting bit FS from the function setting memory 35.

The boot blocks B7 and B8 are located at a position having a block selection address in the lower position in the memory cell array 20. Consequently, the boot block is selected when the block selection address supplied to the block decoder 30 is an address selecting B7 and B8. In response to the block selection signal BS, therefore, the row decoder 22 selects the wordline WL within the corresponding boot blocks B7, B8 and the column decoder 24 selects the bitline BL within the corresponding boot blocks B7, B8.

Meanwhile, when the top boot block, with the block selection address in the upper position, is designated as required by the user, the function setting bit designating such upper position is stored within the function setting memory 35. Consequently, since the supplied address Add1 is inverted within the block address supply circuit 29 in response to the function setting bit FS, the memory device can be a device corresponding to the top boot block. Also, when the bottom boot block, with the block selection address in the lower position, is designated as required by the user, the function setting bit designating such lower position is likewise stored within the function setting memory 35. Consequently, the supplied address Add1 is not inverted within the block address supply circuit 29 in response to the function setting bit FS and is supplied to the boot block decoder. As a result, the memory device corresponds to the bottom boot block.

In this way, the information to set the function is stored within the function setting memory 35. As a result, the top boot block format and bottom boot block format can be used together even in memory devices with the same memory cell array constitution. Therefore, the efficiency of production can be increased.

Figure 2:
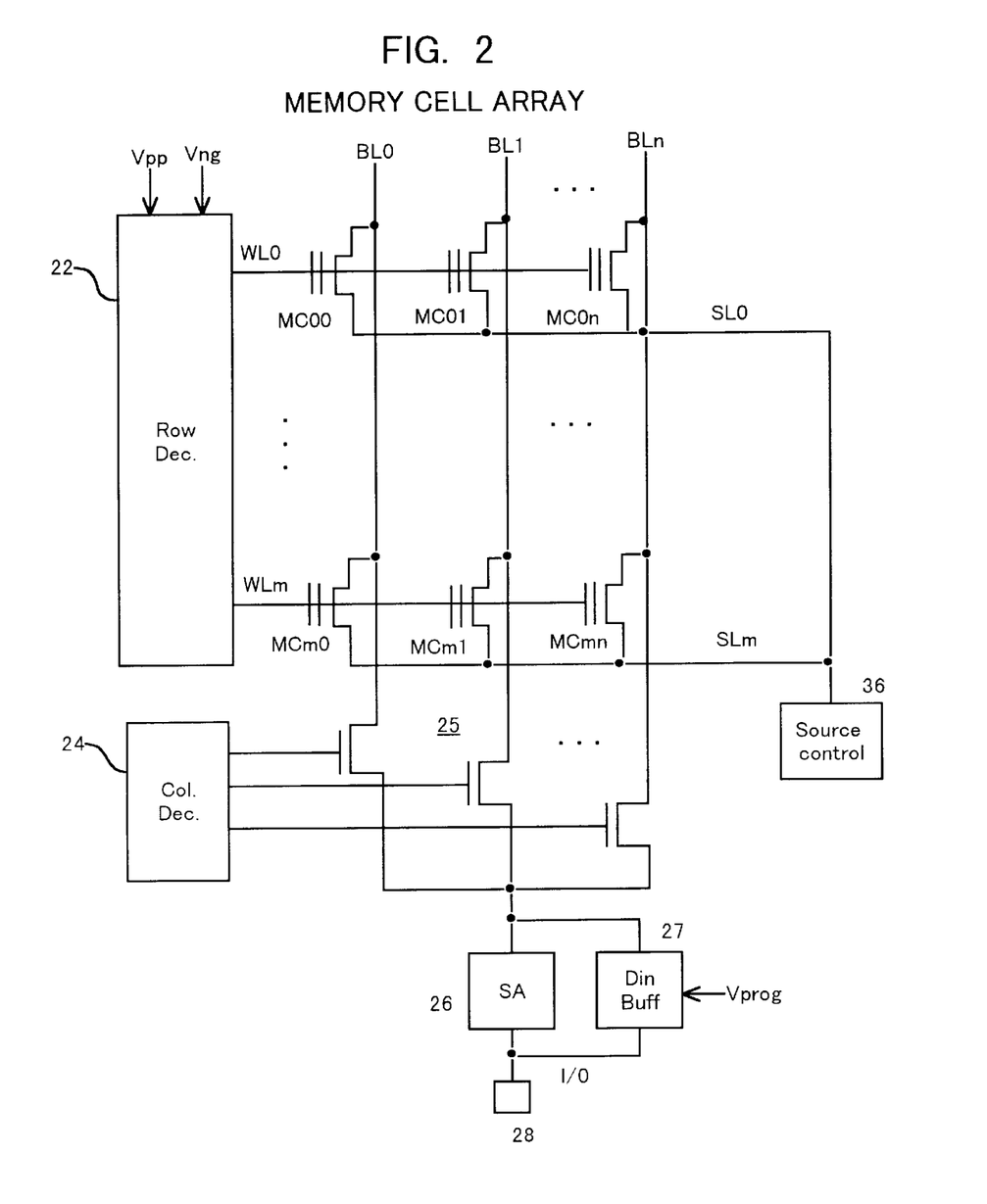
FIG. 2 is a diagram of the constitution of a memory cell array.

FIG. 2 shows the constitution of a memory cell array. Memory cells $MC_{00}$–$MC_{mn}$, comprising floating gate N channel MOS transistors, are provided at the intersections of the wordlines $WL_0$–$WL_m$ and bitlines $BL_0$–$BL_n$. The drain terminals of the transistors in the memory cells are connected to the corresponding bitlines $BL_0$–$BL_n$ and the control gates are connected to the wordlines $WL_0$–$WL_m$. The source terminals of the memory cell transistors are connected to the source control circuit 36 by means of the source lines $SL_0$–$SL_m$.

The operations of reading, erasing, and writing (programming) to the memory cells in such a memory cell array are as follows. In writing (programming), a voltage Vpp (such as 10 V) higher than the voltage Vcc is applied to the wordlines WL, a program voltage Vprog (3–5 V) is applied to the bitlines BL, and the source lines SL are put at ground potential. As a result, electrons flow into the floating gate and the threshold voltage of the memory cell transistor rises.

In erasing, negative voltage Vng is applied to the wordlines WL, the bitlines are put in a floating state, and erase voltage Ver (for example, 5 V or Vcc) is applied to the source lines SL. As a result, electrons are pulled out from the floating gate and the threshold voltage of the memory cell transistor decreases.

In reading, an intermediate voltage, between the threshold voltage after programming and the threshold voltage after erasing, is applied to the wordlines; the memory cell transistor is caused to become non-conductive or conductive, according to whether it is in the programming state or erasing state; and the status is detected by the sense amp 26 by means of the bitlines BL.

As noted above, reading, erasing, and writing (programming) to the memory cells in the memory cell array is carried out by controlling the potential or state of the wordlines, bitlines, and source lines.

Figure 3:
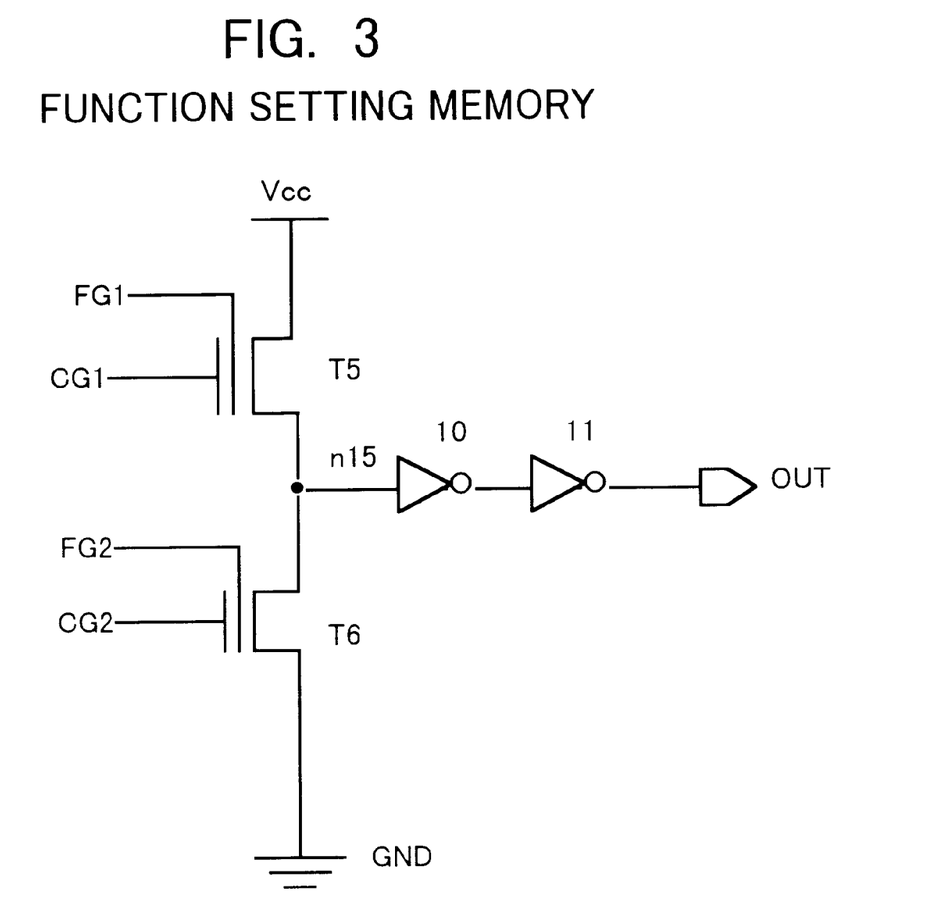
FIG. 3 is a circuit diagram of a memory device used in function setting memory.

FIG. 3 is a circuit diagram of a memory device used in function setting memory. This memory device comprises floating gate types of a first N channel MOS transistor T5 and a second N channel MOS transistor T6, serially connected between the ground GND and power source Vcc. The contact point n15 thereof is connected to an output OUT by means of inverters 10 and 11. The first and second transistors T5 and T6 respectively comprise floating gates FG1, FG2 and control gates CG1, CG2. In this method of storing information, a first datum is stored by writing (programming) to the first transistor T5 and erasing the second transistor T6; and a second datum, the inverse of the first datum, is stored by erasing the first transistor T5 and writing (programming) to the second transistor T6.

When the first datum is stored in the memory device in FIG. 3, the threshold voltage of the first transistor becomes high and the threshold voltage of the second transistor becomes low. Consequently, when a read voltage, which is between those threshold voltages, is applied to each control gate CG1, CG2, the transistor T5 becomes non-conductive, the transistor T6 becomes conductive, and the node n15 becomes L level. In that case, through current from the power source Vcc to ground does not occur because the transistor T5 is non-conductive.

Meanwhile, when the second datum is stored, the operation becomes the opposite of that above. Consequently, the transistor T5 becomes conductive, the transistor T6 becomes non-conductive, and the node n15 becomes H level. Through current does not occur in this case either.

Consequently, by storing the first or second datum as above using the memory device in FIG. 3, through current does not occur and power consumption does not increase even if the control gates CG1 and CG2 are continually maintained at the read voltage. Consequently, the memory device in FIG. 3 does not require power down control maintaining the control gate at ground potential; continually maintaining the control gates CG1 and CG2 at read voltage does not cause power consumption to increase. In other words, the stored function setting data can be continually maintained in node n15 in a reading state without an increase in power consumption. As a result, the reading speed can be increased because it is not necessary to raise the voltage of the control gates for reading when switching from a power down state to an active state as in the conventional memory devices.

Figure 4:
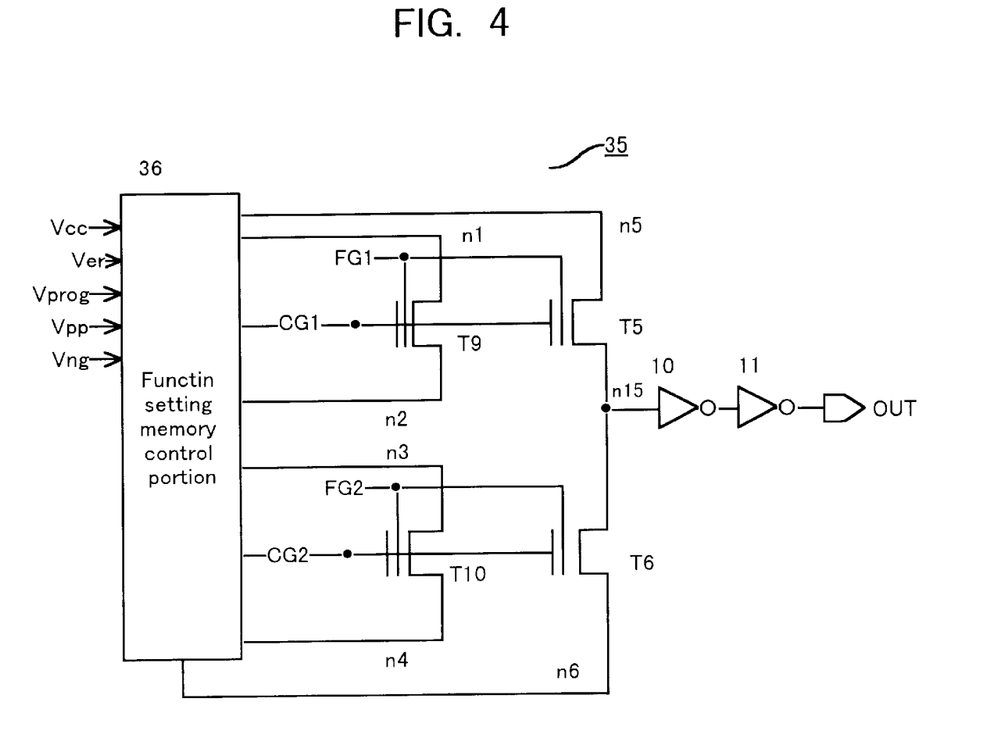
FIG. 4 is a more detailed circuit diagram of a memory device used in function setting memory.

FIG. 4 is a more detailed circuit diagram of a memory device used in function setting memory. This is an example wherein the first and second transistors T5 and T6 are supplemented with writing and erasing transistors T9 and T10, which share the floating gates FG1 and FG2 therewith. The control gates CG and source and drain terminals n1, n2, n3, and n4 of the writing and erasing transistors T9 and T10 are controlled individually by the function setting memory control portion 36. The drain terminal n5 and source terminal n6 of the first and second transistors T5 and T6 may also be controlled individually by the function setting memory control portion 36.

The ratio W/L (channel width/channel length) of the writing and erasing transistors T9 and T10 is designed to be less than the ratio W/L of the reading transistors T5 and T6. In other words, the first and second transistors T5 and T6, which are used for reading, must drive the inverters 10, 11 and are required to have a certain driving capacity. Consequently, the ratios W/L of those transistors are designed to be a certain size. Meanwhile, the writing and erasing transistors T9 and T10 need to have small driving capacity during writing and erasing and therefore the transistors' ratio W/L is designed to be small. The ratio being small does not cause any problems because these transistors T9 and T10 do not need to drive anything.

Figure 5:
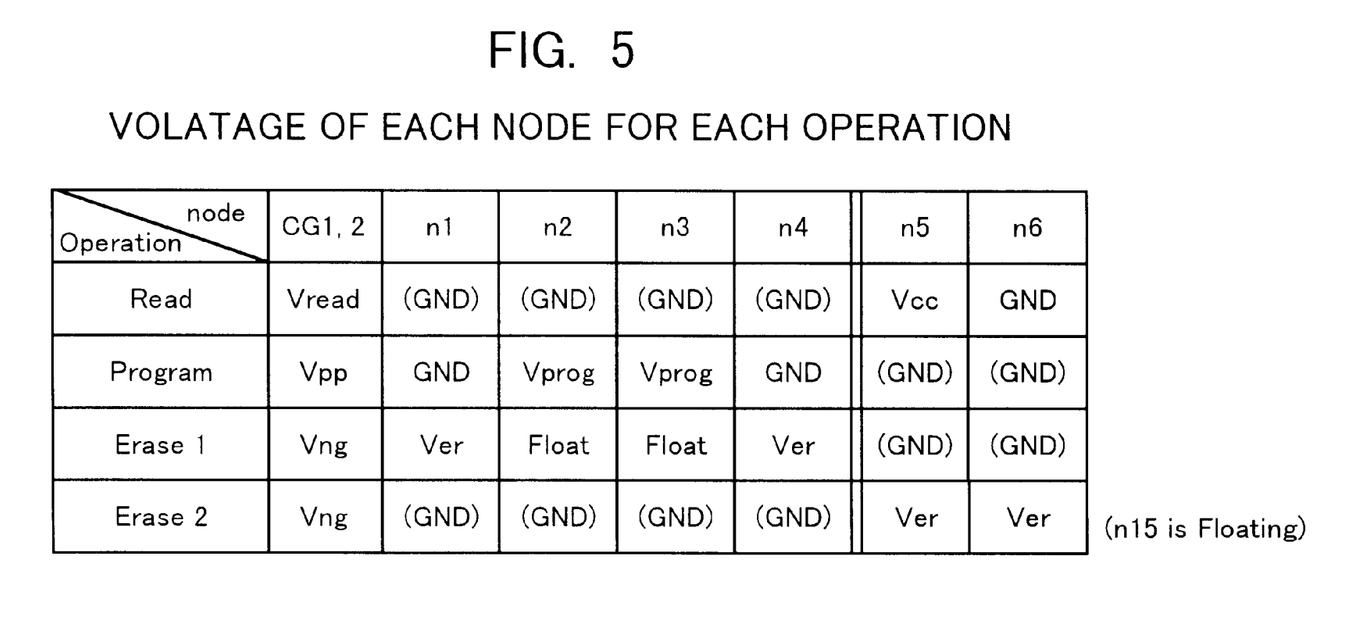
FIG. 5 is a chart showing the relationship between the voltage of the nodes corresponding to each operation of the function setting memory device in FIG. 4.

FIG. 5 is a chart showing the relationships among the voltage of the nodes corresponding to each operation of the function setting memory device in FIG. 4. Writing and erasing to the memory device in FIG. 4 are carried out by means of the writing and erasing transistors T9 and T10; reading is carried out by the first and second transistors T5 and T6.

In the case of writing (programming) to the first transistor T5, the function setting memory control portion 36 holds the control gate CG1 at the high voltage Vpp, the node n1 at ground, and node n2 at the program voltage Vprog. As a result, electrons are caused to flow into the floating gate FG1. In that case, the nodes n5 and n6 are held at ground potential. When erasing the first transistor T5, the function setting memory control portion 36 holds the control gate CG1 at negative voltage Vng, the node n1 at erase voltage Ver (for example, Vcc), and the node n2 in the floating state. As a result, electrons are pulled from the floating gate FG1. This erase is the control operation shown by "Erase 1" in FIG. 5.

Writing (programming) and erasing to the second transistor T6 are carried out by the transistor T10 controlling nodes n3 and n4 in the same manner.

In the read operation, nodes n1–n4 are all put at ground potential, node 5 is set at power source Vcc, and node n6 at ground potential; read voltage Vread (for example Vcc) is applied to control gates CG1 and CG2. As a result, one of the transistors T5 and T6 is conductive, while node n15 becomes H level or L level. More specifically, control gates CG1 and CG2 are usually maintained at read voltage and, during writing and erasing, are held at different voltages Vpp, Vng as noted above. Consequently, the node n15 continually outputs H level or L level depending on the stored data, except during writing and erasing.

Transistors T5 and T6 may also be used in the erase operation. In that case, as shown in "Erase 2" in FIG. 5, nodes n1–n4 are all maintained at ground, control gates CG1 and CG2 are set at negative voltage Vng, and nodes n5 and n6 are held at the erase voltage Ver. In that case, the node n15 enters a floating state. As a result, electrons are pulled from floating gates FG1 and FG2 and the threshold voltage of those transistors drops.

As above, a function setting memory is constituted using the same N channel MOS transistors with floating gates as used for the memory cell transistors within the memory cell array of a memory device. Moreover, in this constitution, the first and second floating gate N channel MOS transistors are serially connected between the power source Vcc and ground; data are recorded by adding electrons to one transistor while pulling electrons from the other transistor. As a result, only one transistor is conductive and through current does not flow even when read voltage is applied to the control gates of both transistors. Consequently, except during writing and erasing, the potential of the control gates is continually maintained at read voltage. This makes possible an access time to the function setting memory of virtually zero without an increase in power consumption.

The function setting memory is not limited to function data regarding the position of the boot block. For example, the function setting memory can also be used as memory for storing redundant addresses. Also, the function setting memory can be used as memory for initial value data for setting functions of other memory devices.

As explained above, the present invention makes possible increased access speed to memory devices without increasing power consumption.

What is claimed is:

1. A non-volatile memory comprising a plurality of floating gate-type memory cells, comprising:
    a plurality of normal memory blocks comprising said memory cells;
    a boot memory block comprising said memory cells;
    a block decoder which is supplied a block selection address and which selects said plurality of normal memory blocks and boot memory block;
    an address supply portion for inverting or not inverting the block selection address supplied to said block decoder depending on a function setting bit; and
    function setting memory for storing said function setting bit;
    wherein said function setting memory comprises:
        a first and second floating gate MOS transistor which are electrically written and erased and which are operatively connected between power sources serially; and
        an output terminal connected to the contact point of said first and second MOS transistors;
        wherein a first datum is stored by writing to said first MOS transistor and erasing said second MOS transistor, and a second datum is stored by erasing said first MOS transistor and writing to said second MOS transistor.

2. The memory according to claim 1, wherein:
    during reading of said stored data, the gates of said first and second MOS transistors are maintained at a voltage higher than the threshold voltage following said erasing and lower than the threshold voltage following said writing.

3. The memory according to claim 1 or 2, which further comprises:
    a third MOS transistor, having a floating gate shared with said first MOS transistor, for adding and pulling electrons from the floating gate during said writing and erasing; and
    a fourth MOS transistor, having a floating gate shared with said second MOS transistor, for adding and pulling electrons from the floating gate during said writing and erasing.

* * * * *